(12) United States Patent
Hisaka

(10) Patent No.: US 6,876,011 B1
(45) Date of Patent: Apr. 5, 2005

(54) SEMICONDUCTOR DEVICE

(75) Inventor: Takayuki Hisaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/660,705

(22) Filed: Sep. 12, 2003

(30) Foreign Application Priority Data

Feb. 13, 2003 (JP) ........................................ 2003-034678

(51) Int. Cl.[7] ...................... H01L 31/072; H01L 31/109; H01L 31/0328; H01L 31/0336
(52) U.S. Cl. ........................................ 257/194; 257/192
(58) Field of Search .......................... 257/192, 194–195

(56) References Cited

U.S. PATENT DOCUMENTS 5,504,353 A * 4/1996 Kuzuhara .................. 257/194
5,789,767 A * 8/1998 Omura ...................... 257/194
5,900,653 A * 5/1999 Suzuki et al. .............. 257/194

FOREIGN PATENT DOCUMENTS

| EP | 0 301 862 | 1/1989 |
|---|---|---|
| JP | 6-244218 | 9/1994 |
| JP | 9-205196 | 8/1997 |
| JP | 9-246528 | 9/1997 |

OTHER PUBLICATIONS

C.S. Whelan et al., "Low Noise $In_{0.32}(AlGa)_{0.68}As/In_{0.43}Ga_{0.57}As$ Metamorphic HEMT on GaAs Substrate with 850 mW/mm Output Power Density", *IEEE Electron Letters,* Jan. 2000, pp. 5–8; vol. 21, No. 1.

J.C.M. Hwang, "Gradual Degradation Under RF Overdrive Of MESFETs and PHEMTs", *GaAs IC Symposium,* 1995, pp. 81–84.

Y.A. Tkachenko et al., "Hot–Electron–Induced Degradation of Metal–Semiconductor Field–Effect Transistors", *GaAs IC Symposium,* 1994, pp. 259–262.

L. Aucoin et al., "PHEMT Reliability: The Importance of RF Life Testing", *GaAs Mantech,* 1997, pp. 42–45.

* cited by examiner

Primary Examiner—Cuong Nguyen
(74) Attorney, Agent, or Firm—Leydig, Voit & Mayer, Ltd.

(57) ABSTRACT

A semiconductor device includes a semiconductor substrate, a channel layer, a Schottky layer, a first layer having a narrow band gap than the Schottky layer, a second layer having band discontinuity with the Schottky layer, a gate electrode, an n+ layer, a source electrode, and a drain electrode. The first and second layers are within the Schottky layer, and the second layer is disposed on the first layer.

5 Claims, 4 Drawing Sheets

SEMICONDUCTOR DEVICE

BACKGROUND OF THE INVENTION

1. Field of the Invention

The present invention relates to a semiconductor device such as a metal-semiconductor field effect transistor and a pseudomorphic high electron mobility transistor.

2. Background Art

Schottky gate field effect transistors, such as a metal-semiconductor field effect transistor (hereinafter referred to as MESFET), a pseudomorphic high electron mobility transistor (hereinafter reffered to as PHEMT), and the like using GaAs or InP are used in a microwave band to a milliwave band. These devices have been known to undergo elemental deterioration caused by an electric field in the case of a high radio frequency (hereinafter referred to as RF) output operation described in GaAs IC symposium (1995), pp81–84 and GaAs IC symposium (1994), pp259–262. Particularly it is demanded of high frequency transistors to have high frequency characteristics, so that elemental dimensions, such as gate length and channel depth, are designed to be smaller. When such an element is operated under high voltage, the electric field becomes very high and therefore a characteristic deterioration caused by the electric field is easily caused. For example, GaAs PHEMTs are reduced in output in an RF reliability test preformed at room temperature and the temperature of these devices becomes high when they are operated as described in the GaAs MANTECH (1997), pp42–45.

Also, in a high electron mobility transistor which is provided with a first semiconductor layer having a narrow band gap and a second semiconductor layer having a wide band gap, a two-dimensional electron gas channel is formed at the boundary between the first semiconductor layer and the second semiconductor layer. A third semiconductor layer, as a gate section, forms a p-n junction between itself and the second semiconductor layer and has a conduction band edge higher than that of the second semiconductor layer. Thus, a barrier is disposed on the second semiconductor layer, thereby constituting the transistor, as described in Japanese Laid-Open Patent Publication No. 64-36080. Further, there is a compound semiconductor device in which a compound semiconductor layer (energy barrier layer) having a larger band gap than a carrier supply layer and a buffer layer is inserted into these layers. A energy barrier against carrier flow is formed, decreasing leakage current and also improving low noise properties as described in Japanese Laid-Open Patent Publication No. 6-244218. Also, there is a high electron mobility transistor in which a layer having a large forbidden band width is formed in the carrier supply layer to prevent inflow of holes as described in Japanese Laid-open Patent Publication No. 9-205196.

The deterioration mechanism of a PHEMT is considered to be as follows. First, hot carriers, hot electrons or hot holes, having high energy due to impact ionization when the PHEMT is operated in a high electric field are generated. These hot carriers reach the surface of a semiconductor device and deteriorate the surface. In the case where these hot carriers are hot electrons, they are trapped by a surface passivation film and a depletion layer is widened by the negative charge, causing channel contraction. Alternatively, the hot carriers may cause damage to the surface of the semiconductor device. As a consequence, the 1 max value drops, so that the characteristics of the PHEMT are deteriorated. This deterioration mechanism becomes more significant with an increased electric field. Also, because impact ionization energy is large in InP type HEMT or metamorphic HEMT which improves high frequency characteristics, the deterioration is significant.

SUMMARY OF THE INVENTION

It is an object of the present invention to restrict the characteristic deterioration caused by an electric field in the semiconductor device such as a MESFET and a PHEMT.

In accordance with one aspect of the present invention, there is a semiconductor device including a semiconductor substrate, a channel layer formed on the semiconductor substrate, a Schottky layer formed on the channel layer, a first layer having a narrower band gap than the Schottky layer, a second layer having band discontinuity with the Schottky layer, a gate electrode disposed on the Schottky layer, n+ layer formed on the Schottky layer on both sides of the gate electrode, the n+ layer having discontinuous parts positioned on the gate electrode, a source electrode formed on the first n+ layer, and a drain electrode formed on the second n+ layer. The first and second layers are inserted in the Schottky layer, and the second layer is disposed on the first layer.

BRIEF DESCRIPTION OF THE DRAWINGS

The present invention will become readily understood from the following description of preferred embodiments thereof made with reference to the accompanying drawings, in which like parts are designated by like reference numeral, and in which.

DESCRIPTION OF THE PREFERRED EMBODIMENTS

A semiconductor device according to an embodiment of the present invention will be explained with reference to accompanying drawings. It is to be noted that in these drawings, the same symbols are affixed to substantially the same parts.

First Embodiment

Figure 1:
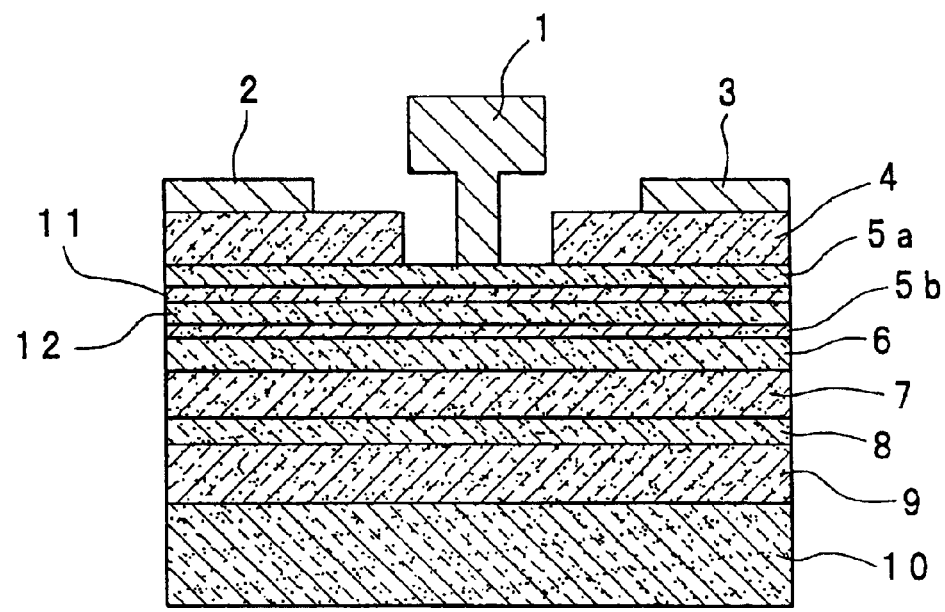
FIG. 1 is a sectional view of a semiconductor device according to a first embodiment of the present invention.
Figure 2:
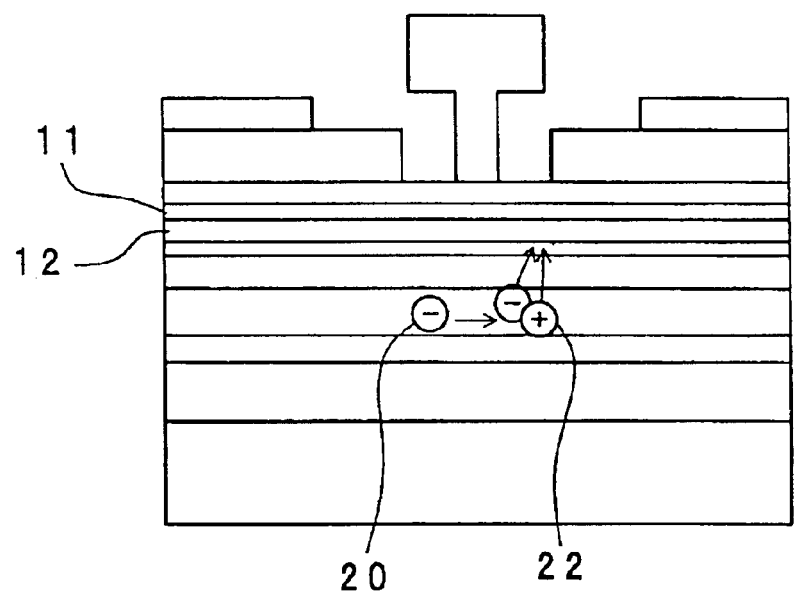
FIG. 2 is a schematic view of a process in which hot carriers recombine and become extinct due to a barrier layer and a recombination layer in the semiconductor device shown in FIG. 1.

A semiconductor device according to a first embodiment of the present invention will be explained with reference to FIG. 1 and FIG. 2. FIG. 1 is a sectional view of the semiconductor device. This semiconductor device is a pseudomorphic high electron mobility transistor (PHEMT) using InGaAs layer as the channel layer. Also, in this semiconductor device, an AlGaAs buffer layer 9, a lower electron supply layer 8 doped with Si, an InGaAs channel layer 7, an upper electron supply layer 6 doped with Si and AlGaAs Schottky layers 5a and 5b are laminated in this order on a GaAs substrate 10. This semiconductor device is characterized in that, further, a recombination layer 12 and a barrier layer 11 disposed on the recombination layer 12 are sandwiched between two Schottky layers 5a and 5b. A gate electrode 1 is disposed on the Schottky layer 5b. Also, a source electrode 2 and a drain electrode 3 are respectively disposed apart in the opposite directions from the gate electrode 1 above the Schottky layer 5b through an n+ GaAs layer 4.

Here, as the Schottky layer 5, an AlGaAs layer in which the mol ratio of Al is 0.24 or less is usually used. Also, the barrier layer 11 is made of a semiconductor material having bands (ΔEc and ΔEv) discontinuous to the Schottky layer 5 and has a barrier effect on carriers such as holes or electrons. As the barrier layer 11, an AlGaAs layer or InGaP layer in which the mol ratio of Al is 0.4 or more which is higher than of the Schottky layer 5 may be used. Further, the recombination layer 12 is made of a material having a narrower band gap than the Schottky layer 5. As the recombination layer 12, for example, an InGaAs layer doped with oxygen may be used. A layer having a lattice defect in the interface or within the layer may also be used as the recombination layer 12.

Next, the effect obtained by the recombination layer 12 and the barrier layer 11 disposed between the Schottky layers 5a and 5b will be explained with reference to FIG. 2. FIG. 2 is a schematic view showing a process in which hot carriers generated in the channel layer 4 due to a high electric field become extinct in the recombination layer 12 in a high RF output operation. Since the barrier layer 11 exists, these hot carriers generated due to a high electric field does not reach the surface above the barrier layer 11 and the deterioration of the surface caused by the hot carriers is therefore suppressed. Also, the hot carriers intercepted by the barrier layer 11 become extinct by the recombination of holes and electrons in the recombination layer 12 disposed under the barrier 11. In the case where there is no recombination layer 12, it is considered that when the hot carriers, for example, hot holes, intercepted by the barrier layer 11 are accumulated under the barrier layer, this causes a drop in potential and an increase in Ids, giving rise to a kink waveform. In this semiconductor device, a surface deterioration caused by hot carriers is prevented and the accumulation of the hot carriers can be avoided by providing the barrier layer 11 and the recombination layer 12 under the barrier layer.

It should be noted that each electrode may be covered with insulator with keeping a contact face. The semiconductor device may be packaged within a case.

Second Embodiment

Figure 3:
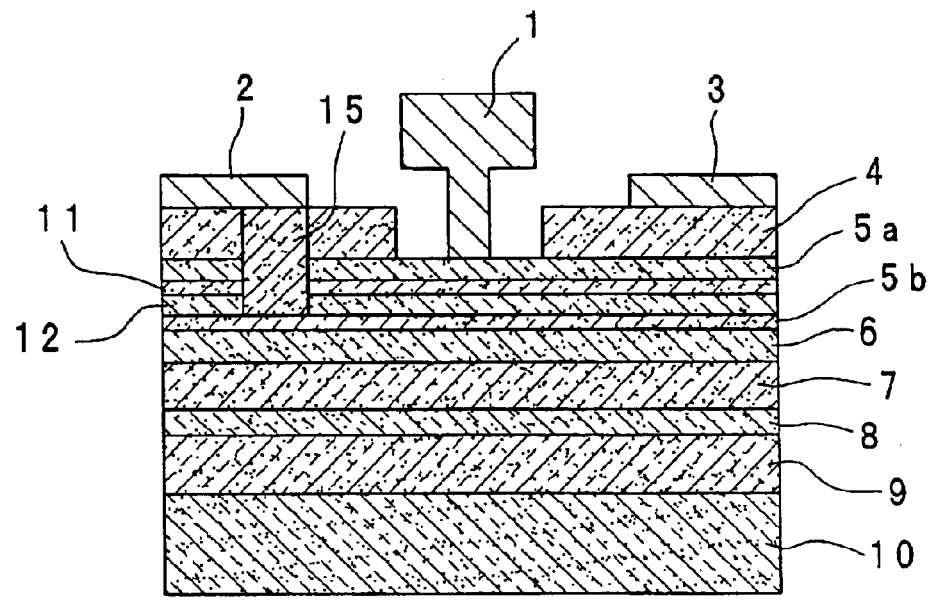
FIG. 3 is a sectional view of a semiconductor device according to a second embodiment of the present invention.

A semiconductor device according to a second embodiment of the present invention will be explained with reference to FIG. 3 and FIG. 4. FIG. 3 is a sectional view of this semiconductor device. This semiconductor device is characterized in that a recombination layer 12 and a barrier layer 11 disposed on the recombination layer 12 are sandwiched between two Schottky layers 5a and 5b. The semiconductor device is also characterized in that a p+ contact layer 15 is disposed under a source electrode 2, the p+ contact layer 15 penetrating through an n+ layer 4, the Schottky layer 5a, the barrier layer 11 and the recombination layer 12 and connecting the source electrode 2 with the Schottky layer 5b. This p+ contact layer 15 is formed by ion implantation using a p-type dopant Mg, C or the like.

Figure 4:
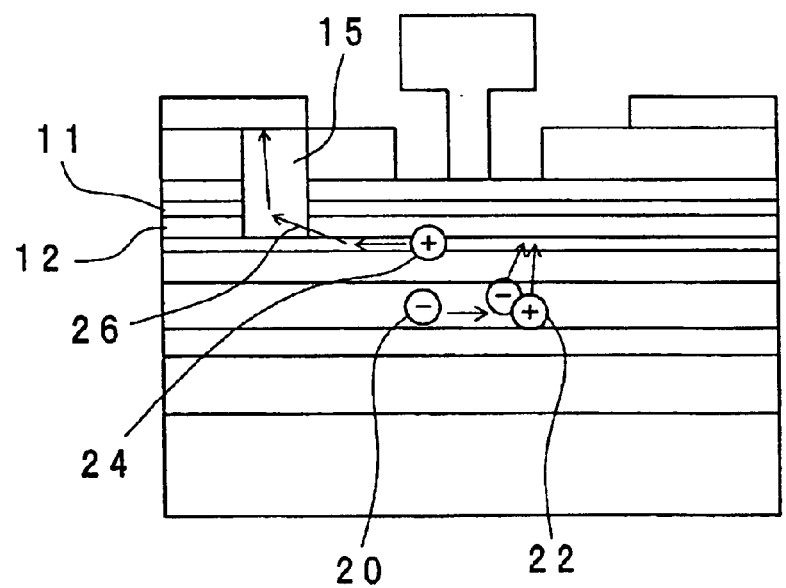
FIG. 4 is a schematic view of hot holes flowing under a barrier layer into a source electrode through a p+ layer under the source electrode in the semiconductor device shown in FIG. 3.

Next, explanations will be furnished as to the effect of the p+ contact layer 15 with reference to FIG. 4. FIG. 4 is a schematic view showing a process of flowing a hot hole 26 existing under the barrier layer 11 into the source electrode 2 by the p+ contact layer 15 disposed under the source electrode 2. For this, the accumulation of holes under the barrier layer 11 is restricted.

Third Embodiment

Figure 5:
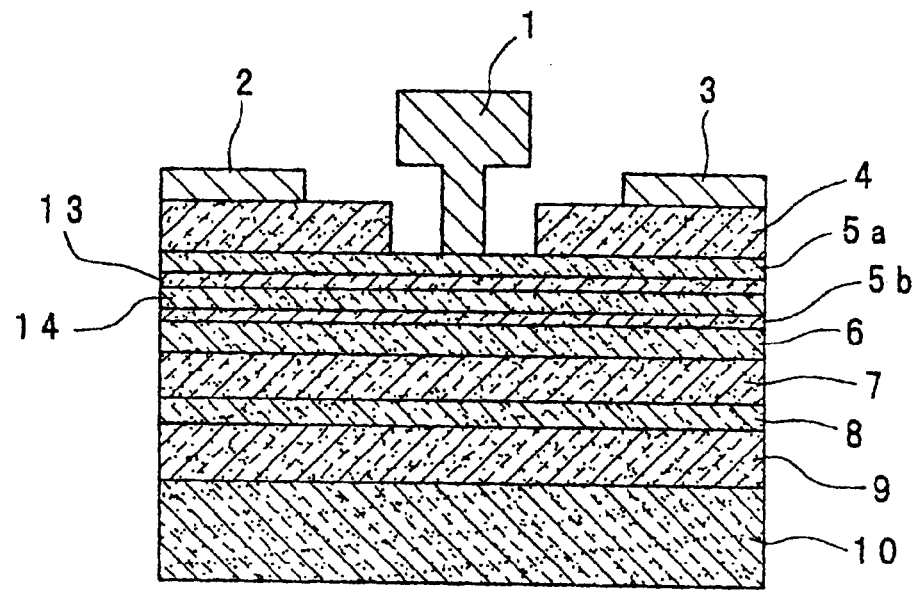
FIG. 5 is a sectional view of a semiconductor device according to a third embodiment of the present invention.

A semiconductor device according to a third embodiment of the present invention will be explained with reference to FIG. 5. FIG. 5 is a sectional view of this semiconductor device. This semiconductor device is characterized in that an n-type-doped layer 13 and a p-type-doped layer 14 disposed under the n-type-dopant layer 13 are placed between Schottky layers 5a and 5b. Since the n-type-doped layer 13 is laminated on the p-type-doped layer 14, potential is dropped in the n-type-doped layer 13 and potential is raised in the p-type-doped layer 14, causing band discontinuity. For this, the semiconductor device has an barrier effect on hot holes.

Fourth Embodiment

Figure 6:
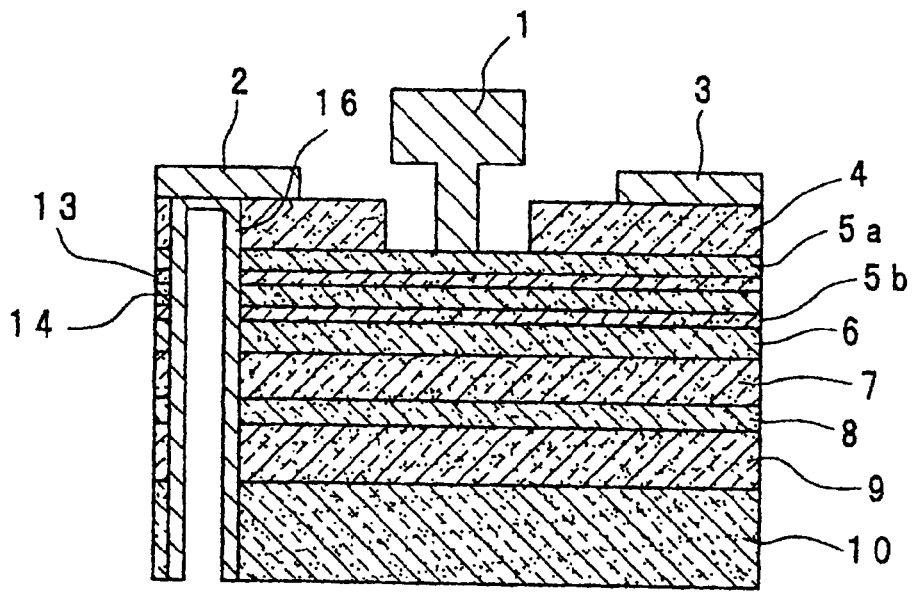
FIG. 6 is a sectional view of a semiconductor device according to a fourth embodiment of the present invention.

A semiconductor device according to a fourth embodiment of the present invention will be explained with reference to FIG. 6. FIG. 6 is a sectional view of this semiconductor device. This semiconductor device is characterized in that an n-type-doped layer 13 and a p-type-doped layer 14 disposed on the n-type-doped layer 13 are sandwiched between two Schottky layers 5a and 5b. The semiconductor device is also characterized by the provision of a via-hole 16 penetrating from a source electrode 2 to a GaAs substrate 10. This via-hole 16 ensures that holes intercepted by the n-type-doped layer 13 and the p-type-doped layer 14 flow from the via-hole 16 to the source electrode. This restricts the accumulation of hot holes.

Although, in this example, the via-hole 16 is opened from the surface of the GaAs substrate 10 and is penetrated up to the source electrode 2, it may be opened from the source electrode 2 and penetrated up to the GaAs substrate 10.

Fifth Embodiment

Figure 7:
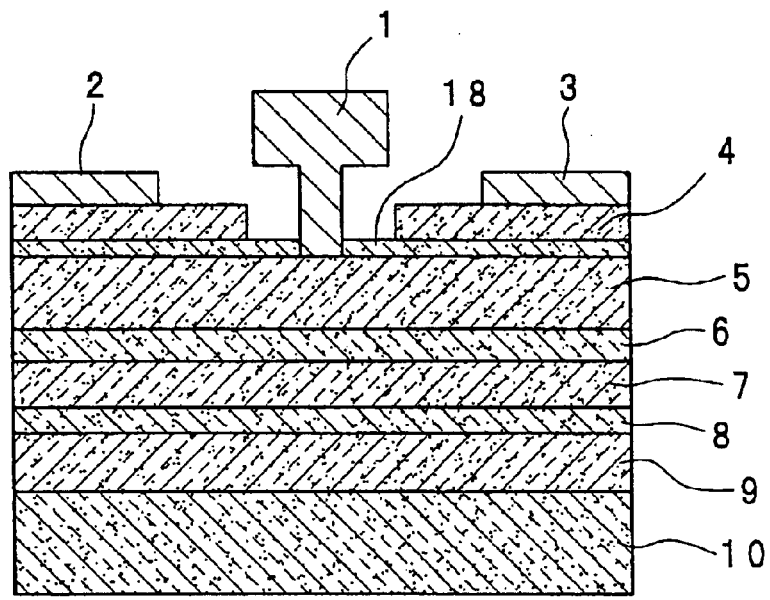
FIG. 7 is a sectional view of a semiconductor device according to a fifth embodiment of the present invention.

A semiconductor device according to a fifth embodiment of the present invention will be explained with reference to FIG. 7. FIG. 7 is a sectional view of this semiconductor device. In this semiconductor device, an AlGaAs buffer layer 9, a lower electron supply layer 8 doped with Si, an InGaAs channel layer 7, an upper electron supply layer 6 doped with Si and an AlGaAs Schottky layer 5 are laminated in this order on a GaAs substrate 10. Also, a gate electrode 1 is disposed on the Schottky layer 5. Also, a source electrode 2 and a drain electrode 3 are respectively disposed apart in the opposite directions from the gate electrode 1 above the Schottky layer 5 through an n+ GaAs layer 4. The InGaAs layer 18 covers the surface of the Schottky layer 5.

Next, a surface deterioration caused by an electric field arises on the surface on the Schottky layer 5. On the other hand, a compound semiconductor containing phosphorus (P) such as InGaP semiconductor and the like is more resistant to oxidation than compound semiconductors such as compound semiconductors containing arsenic (As) such as GaAs and AlGaAs semiconductors. Also, InGaP has large band discontinuity (ΔEv) in a valence band and therefore has a barrier effect upon hot holes. Moreover, InGaP is resistant to surface oxidation. Then, the surface of the Schottky layer 5 is covered with the InGaP layer 18, whereby the surface deterioration can be limited. In the production of this semiconductor device, InGaP having a specific form as shown in FIG. 7 is formed by selective etching of InGaP differing in etching rate from GaAs and AlGaAs.

Sixth Embodiment

Figure 8:
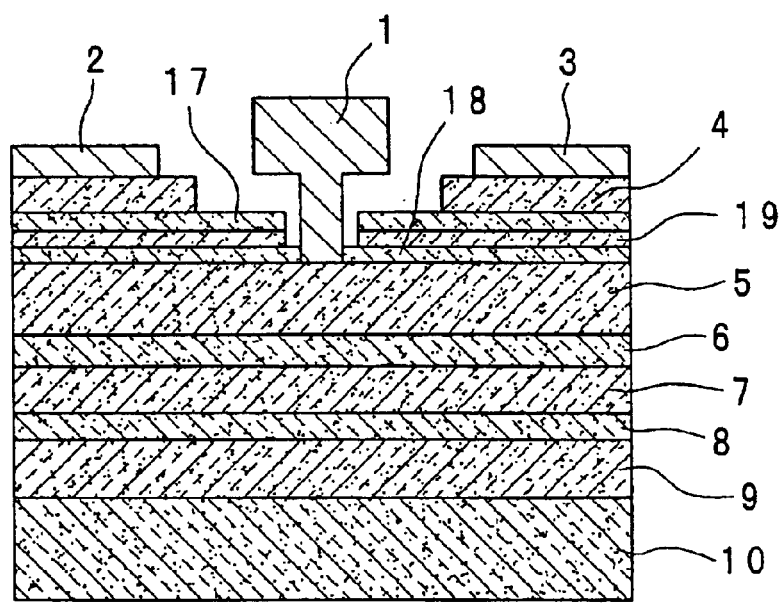
FIG. 8 is a sectional view of a semiconductor device according to a sixth embodiment of the present invention.

A semiconductor device according to a sixth embodiment of the present invention will be explained with reference to FIG. 8. FIG. 8 is a section view of this semiconductor device. In this semiconductor device, an AlGaAs buffer layer 9, a lower electron supply layer 8 doped with Si, an InGaAs channel layer 7, an upper electron supply layer 6 doped with Si and an AlGaAs Schottky layer 5 are laminated in this order on a GaAs substrate 10. Also, a gate electrode 1 is disposed on the Schottky layer 5. Also, a source electrode 2 and a drain electrode 3 are respectively disposed apart in the opposite directions from the gate electrode 1 above the Schottky layer 5 through an n− GaAs layer 19 sandwiched between two InGaP layers 17 and 18 and an n+ GaAs layer 4. The InGaAs layer 18 covers the surface of the Schottky layer 5.

Explanations will be furnished as to the effect obtained by providing the n− GaAs layer 19 sandwiched between these two InGaP layers 17 and 18 and the n+ GaAs layer 4. Like the explanations in the fifth embodiment, a surface deterioration caused by a high electric field is restricted by covering the surface of the Schottky layer 5 and the surface of the n− GaAs layer 19 with InGaP layer 17 and 18.

It is to be noted that although the explanations are furnished taking a GaAs PHEMT as an example, the present invention is not limited to this transistor and is applicable to semiconductors having a FET (field-effect transistor) structure such as MESFETs, InP type HEMTs and metamorphic HEMTs.

The semiconductor device according to the present invention is provided with a recombination layer and a barrier layer disposed on the recombination layer between two Schottky layers. In an RF high output operation, hot carriers generated in a channel layer due to a high electric field are intercepted by the barrier layer, so that they do not reach the surface above the barrier layer. For this, a surface deterioration caused by these hot carriers can be restricted. Also, the hot carriers intercepted by the barrier layer become extinct resulting from the recombination of holes with electrons in a recombination layer disposed under the barrier layer, whereby the accumulation of these hot carriers can be prevented.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor device comprising:

a semiconductor substrate;

a channel layer on the semiconductor substrate;

a Schottky layer on the channel layer;

a first layer having a narrower band gap than the Schottky layer, the first layer being disposed within the Schottky layer;

a second layer having a band discontinuity with the Schottky layer, the second layer being disposed within the Schottky layer, on the first layer;

a gate electrode disposed on the Schottky layer;

first and second n+ layers on the Schottky layer on opposite sides of the gate electrode;

a source electrode on the first n+ layer; and a drain electrode on the second n+ layer.

2. The semiconductor device according to claim 1, wherein the first layer has lattice defects at an interface between the first layer and the Schottky layer.

3. The semiconductor device according to claim 1, further comprising a p+ contact layer connecting the source electrode with the Schottky layer, the p+ contact layer being disposed opposite the source electrode.

4. The semiconductor device according to claim 1, further comprising a via-hole penetrating from the source electrode to the semiconductor substrate.

5. The semiconductor device according to claim 1, further comprising first and second electron supply layers sandwiching the channel layer.

* * * * *